United States Patent [19]

Hallford

[11] Patent Number: 4,625,179
[45] Date of Patent: Nov. 25, 1986

[54] SPACE FEEDBACK APPARATUS FOR FIELD EFFECT TRANSISTORS

[75] Inventor: Ben R. Hallford, Wylie, Tex.

[73] Assignee: Rockwell International Corporation, El Segundo, Calif.

[21] Appl. No.: 784,975

[22] Filed: Oct. 7, 1985

[51] Int. Cl.⁴ .......................... H03F 1/38; H03F 3/60
[52] U.S. Cl. .................................... 330/286; 330/277; 330/291; 330/294
[58] Field of Search ................... 330/53, 56, 286, 291, 330/294, 277

[56] References Cited

U.S. PATENT DOCUMENTS 3,999,142  12/1976  Presser et al. ...................... 330/286

FOREIGN PATENT DOCUMENTS 91717  5/1984  Japan ................................... 330/286

OTHER PUBLICATIONS

Ulrich, "Use Negative Feedback to Slash Wideband VSWR," *Microwaves*, Oct. 1978, pp. 66–68, 70.
Tohyama et al, "23-GHz Band GaAs MESFET Reflection-Type Amplifier," *IEEE Transactions on Microwave Theory and Techniques*, vol. MTT-27, No. 5, May 1979, pp. 408–411.

*Primary Examiner*—James B. Mullins
*Attorney, Agent, or Firm*—Bruce C. Lutz; V. L. Sewell; H. Fredrick Hamann

[57] ABSTRACT

Space feedback comprising a shield over the tuning elements of a FET radio frequency amplifier provides positive feedback between the gate and drain terminals to raise the gain of the amplifier above what it would be without the space feedback, while simultaneously lowering the noise figure. Not only is the relative noise lowered, but the absolute amount of noise is lowered.

4 Claims, 9 Drawing Figures

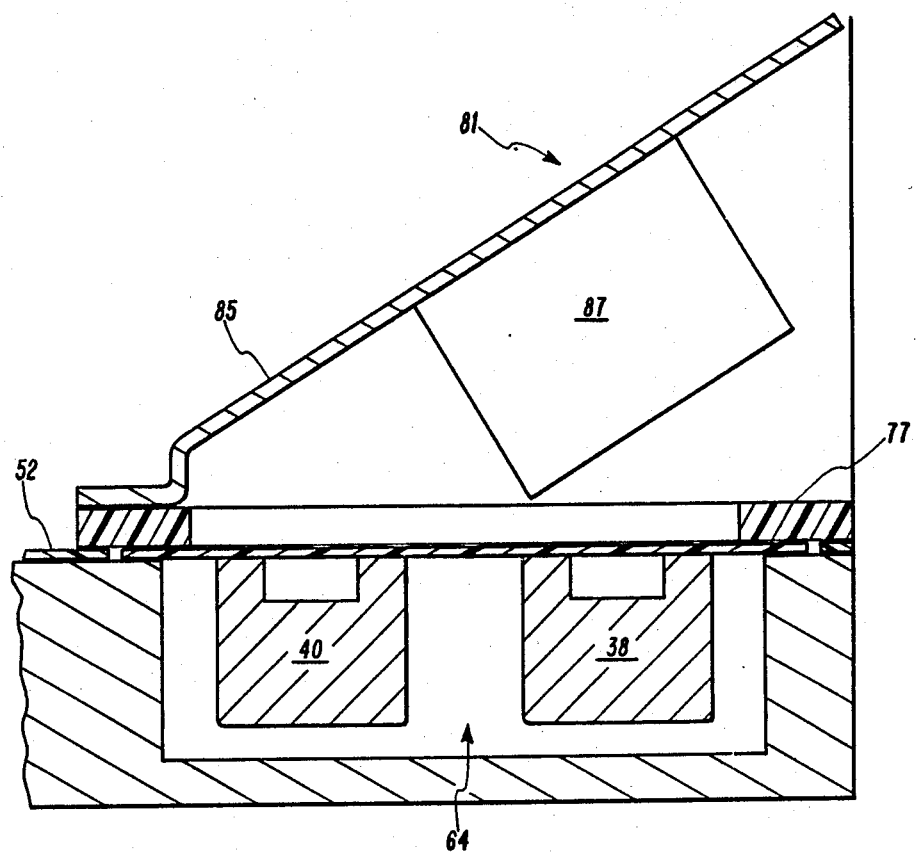
FIG. 6
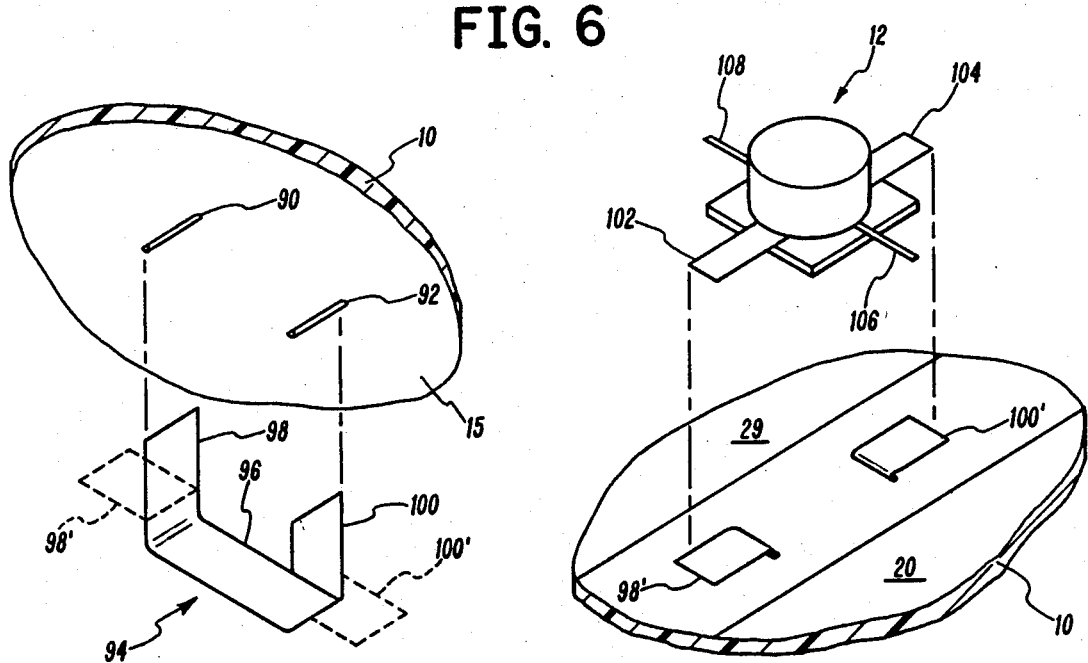
FIG. 7
FIG. 8

SPACE FEEDBACK APPARATUS FOR FIELD EFFECT TRANSISTORS

THE INVENTION

The present invention is directly related to electronics, and more specifically, related to microwave electronic circuitry. Even more specifically, it is related to problems involved with positive space feedback in tuning circuits containing active components, such as field effect transistors (FET's).

BACKGROUND

When designing and manufacturing microwave equipment including low noise amplifiers, the active element, such as a field effect (FET) transistor, must be properly connected to a circuit that presents the optimum source and load impedance to its input and output terminals. Some means must be provided to alter these impedances to compensate for variations in the FET's and in specific circuit dimensions. The higher the frequency involved in the microwave circuit, the more critical these variances become. For microwave low noise amplifier (LNA) circuits that use GaAs MESFET transistors on microstrip circuits, some means must be provided to trim the matching circuit geometry at the transistor terminals to compensate for changes in the optimum source and load impedances of the transistors from different lots. One method of accomplishing this tuning and transistor characteristic matching may be found in a patent granted to the inventor and assigned to the same assignee as the present invention and given U.S. Pat. No. 4,472,690.

Some microwave circuits using ceramic substrates are designed with the FET devices mounted to the ground plane using flanges that may be bolted to a metal plate. Other FET devices are physically mounted using solder type attaching mechanisms. However, in either case, the ceramic substrate that is connected to the FET must be soldered to a common ground plane to ensure intimate contact of the substrate ground plane with the FET ground flange to the chassis ground plane. The impedance matching stubs for a typical FET are etched or plated on a dielectric substrate causing them to present fixed impedances to the FET. When a FET is replaced by a different FET, the different noise parameters require that the impedance matching stubs be retuned using suitable metal or dielectric chips. The tuning operations can be expensive and require trained personnel to carefully assemble and test the amplifiers.

Although the above approaches have worked at frequencies of up to six GHz, the problems associated with the prior art approach are amplified even further as the frequency is extended beyond six GHz.

The gain of the active component such as the FET, which starts at a mediocre value in FET's of today's technology, is typically reduced even more by negative feedback and by the various components used to produce a viable circuit. Thus, to get the gain required for the overall circuit, it is often necessary to add additional active components such as additional FET's.

Additionally, it is often desirable to shield the field radiated by an active circuit working at high frequencies, such as 11 GHz, so that not only is it not affected by signals from other sources, but additionally so that signals radiated by the active components do not affect other nearby circuitry.

The present invention includes a metal shield which is placed over the FET and partially encloses the space above the ground plane, thereby not only shielding signal radiations both received and generated but, also providing positive space signal feedback wherein the gain of the circuit is increased over that normally expected while simultaneously reducing the noise figure of the circuit.

Prior to the present invention, it has been generally accepted by microwave engineers that positive feedback will raise the noise figure of an amplifier even though it will increase gain. This increase in gain is typically at the expense of stability. In other words, the higher the feedback, the poorer the stability. Articles such as that found in "*Microwave*", October 1978, beginning on page 66, typically do not discuss the noise figure in great detail, since they do not appreciably improve the noise figure.

The present invention not only increases the gain through the use of the positive space feedback, while simultaneously providing a shielding effect but, in addition, reduces the noise figure.

It is thus an object of the present invention to improve upon the operation of a high frequency RF amplifier.

Other objects and advantages of the present invention may be ascertained from a reading of the specification and appended claims in conjunction with the drawings wherein:

FIG. 6 is a cross-sectional view through the lines 6—6 of FIG. 4 with the apparatus of FIG. 5 assembled and mounted therein;

FIG. 7 is a isometric view of a clip used in facilitating the connection of an FET on one side of a substrate to the ground plane on the opposite side;

FIG. 8 is a isometric view of the substrate on the side opposite that shown in FIG. 7 showing the clip and the FET to be mounted thereupon.

DETAILED DESCRIPTION

Figure 3:
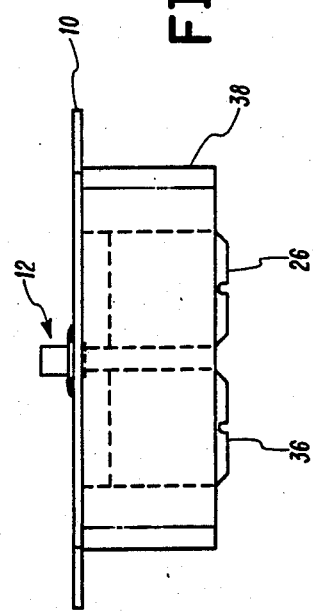
FIG. 3 is an end view of FIG. 1.
Figure 1:
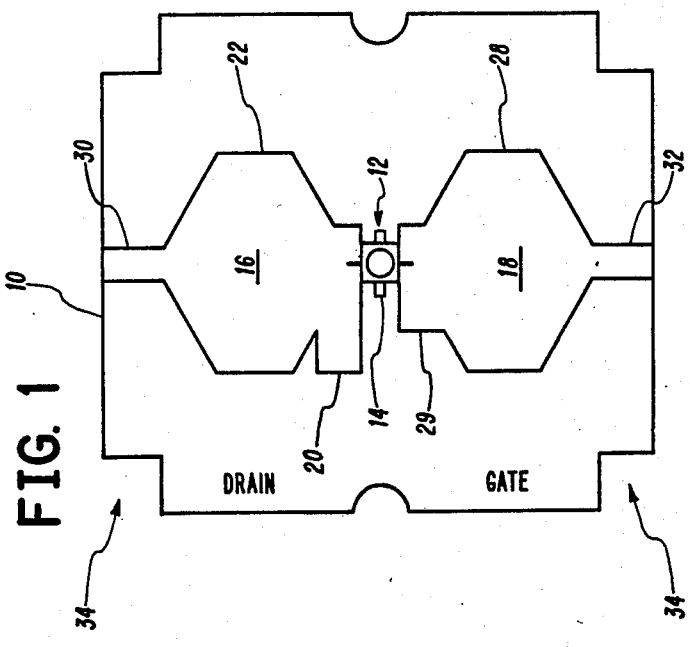
FIG. 1 is a plan view of a module incorporating active and passive components and which is the subject of the invention.
Figure 4:
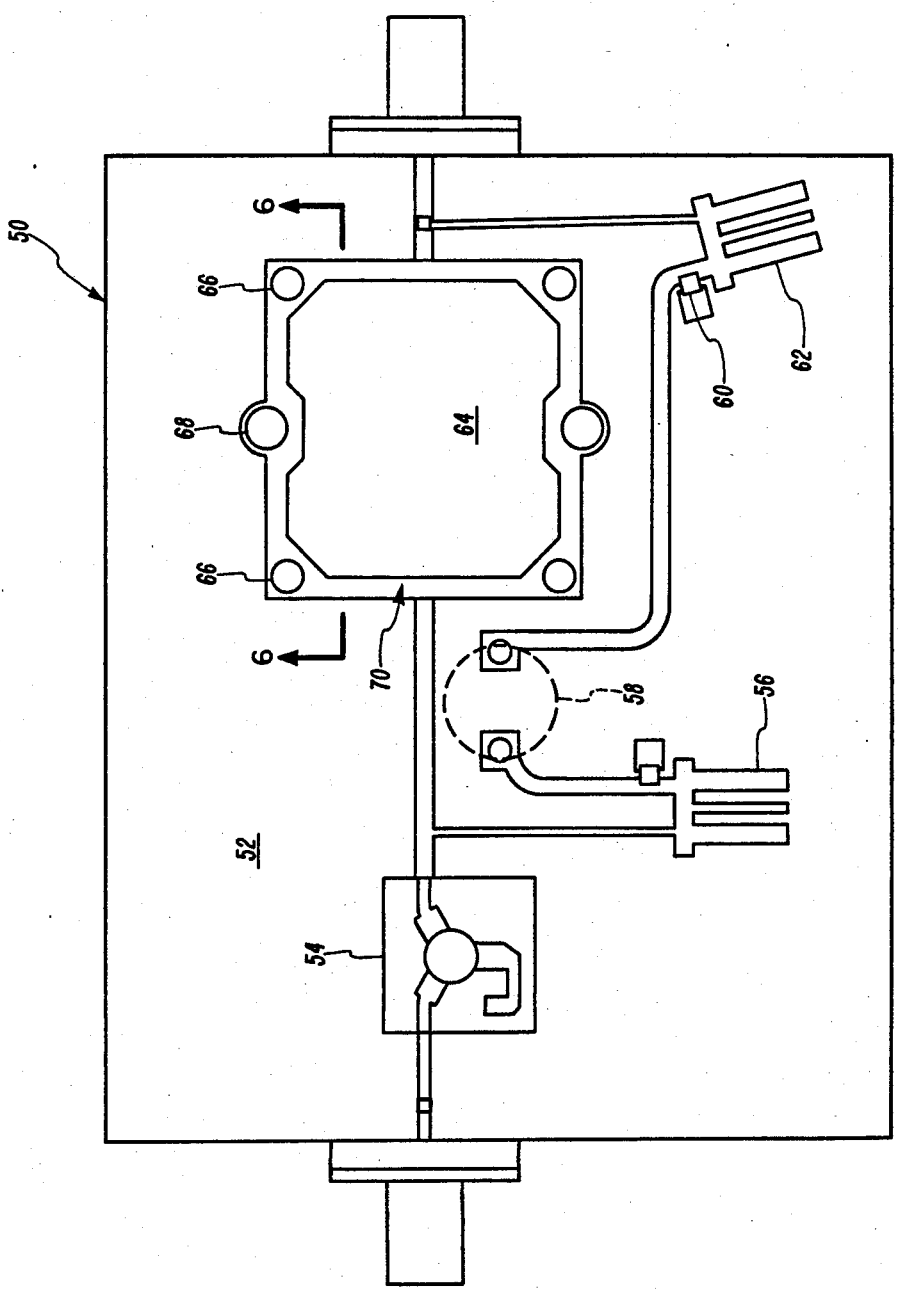
FIG. 4 is a plan view of a microwave circuit having an opening for the insertion of a module of the type shown in FIG. 1.

In FIG. 1, a substrate 10 is shown having mounted thereon an FET 12 having source leads 14 connected through the substrate 10 to a ground plane 15 on the other side, and having its gate and drain leads connected to gate and drain tuning means 18 and 16, respectively. A portion of tuning means 16 closest to FET 12 comprises a fixed open circuited impedance tuning stub 20, while the elongated portion 22 comprises a variable impedance quarter wave transformer portion which acts in conjunction with screw type adjustable slugs, one of which is shown as 24 in FIG. 3. A further adjustable slug 26 is shown in FIG. 3 as coacting with a main portion 28 of tuning means 18. This portion is connected to the gate of FET 12. In addition, there is a fixed open circuited impedance tuning stub 29 which comprises a further portion of tuning means 18. The portion 22 also comprises a part of the transmission path and provides a transition in impedance to a standard width 50 ohm transmission path 30 for connection to transmission paths on a microwave circuit, such as illustrated in FIG. 4. Tuning means 18 includes a transition connected to a typical width 50 ohm circuit path element 32 for connection to another circuit path on a circuit board, such as illustrated in FIG. 4. The corners of the substrate 10 have cut-outs, shown generally as 34, on each of the corners, which allow room for screws or other mounting means to hold the module of FIG. 1 in firm electrical contact with the ground plane of FIG. 4, to be later described.

Figure 2:
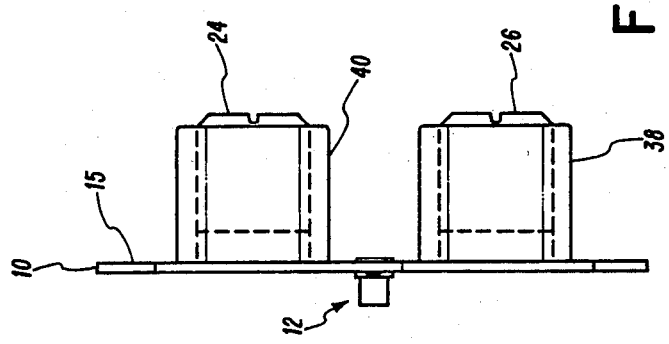
FIG. 2 is a side view of FIG. 1.

FIG. 2 shows many of the components of FIG. 1 and the same numbers are used where applicable. In addition, a further tuning screw 36 is shown for providing a tuning adjustment within a tuner housing 38 and acting in conjunction with tuning screw 26 to affect the impedance of tuning means 18.

FIG. 3 uses the same numbers as are used in FIG. 1 and, in addition, shows a second tuner housing means 40, which houses the tuning screw 24 and, an additional tuning screw, not shown. As will be realized, this set of tuning screws operates in conjunction with the tuning means 16 to affect the impedance at the drain terminal of FET 12.

FIG. 4 shows a metal enclosure, generally designated as 50, having a substrate 52, and a plurality of components, such as 54, 56, dash line component 58 mounted on the opposite side of substrate 52, a capacitor 60 and a filter means 62 similar to that of 56. While these components provide no necessary part of the present inventive concept, they are illustrated for the purpose of completing the presentation of an environment in which the inventive concept can be used. Beneath the substrate 52 is a ground plane which contains a cavity, generally designated as 64, and is deep enough to allow for insertion of the housing means, such as 38 and 40, of the device shown in FIGS. 1 through 3. Screw holes, such as 66 at each corner, and 68 at intermediate positions around the opening 64, are used to provide a mechanical mounting of the module of FIG. 1 with the substrate resting on an upper portion of the ground plane and designated as 70.

Figure 5:
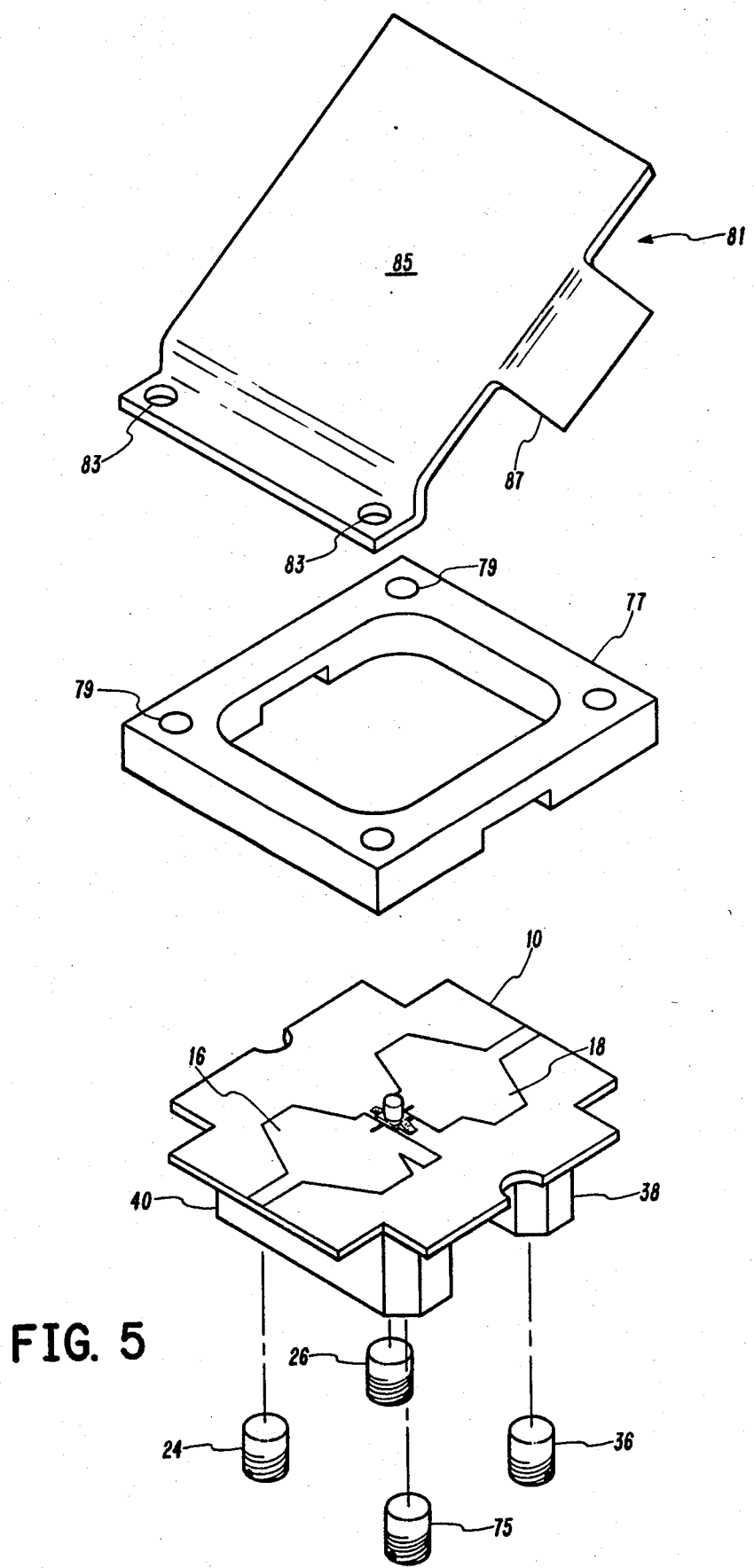
FIG. 5 is an exploded view of the module of FIG. 1 in combination with hold-down and space feedback parts used to properly secure the module of FIG. 1 in FIG. 4, and to enhance the amplifying characteristics of the device.

In FIG. 5, the same numbers are used as used in FIGS. 1 through 3, and shows a final tuning screw 75, in addition to the other three specifically referenced. This exploded view also shows an insulating type holddown device 77, having holes designated as 79. This is used to physically distribute the pressure of the screws over the surface of substrate 10 to provide reasonably uniform contact with the ground plane 70 of FIG. 4. A space feedback shield 81 is shown with holes 83 at one end thereof, a main portion 85 and extended arms or legs 87. The main portion 85 and the arm or leg 87, along with a leg on the other side, not shown, for a U-shaped portion. The part 85 forms an angle with the base containing the holes 83, which in one embodiment of the invention, provided a field perturbing device mounted at an angle of approximately 45° with respect to the surface of the substrate 10 of the module of FIG. 1.

Although, in FIG. 6, screws are not shown for holding the items in place, the module along with the holddown device 77 and the space feedback portion 81 are shown in assembled positions with respect to the substrate 52 and the ground plane 70, including the cavity 64 as illustrated in FIG. 4. As before, the numbers used in previous figures are all used as applicable.

In FIGS. 7 and 8, the same numbers are utilized as are used in previous figures. Thus, a portion of the substrate board 10 is shown with the backplane 15 and two opening slots 90 and 92. A U-shaped clip generally designated as 94 has a bit or base portion 96 and first and second leg or tab portions 98 and 100. Dash line portions 98' and 100' illustrate the configuration of the U-shaped member 94 after it is inserted through the slots 90 and 92 and bent over to the position shown in FIG. 8.

In FIG. 8, a view from the topside of substrate 10 is shown wherein the legs 98 and 100 are bent over and given the designation 98' and 100'. When the tabs are in this condition, the bit portion 96 can be electrically soldered to the backplane 15 and provide a consistent impedance from the backplane to the source leads of transistor 12. As illustrated, transistor 12 has source leads 102 and 104 with a drain lead 106 and a gate lead 108. When the transistor 12 is mounted on the substrate, a solder connection is made between source lead 102 and tab 98', as well as making an electrical connection between source lead 104 and tab 100'. Additionally, there is an electrical connection made between the drain lead 106 and the electrical stub 20, and a further electrical connection is made between gate lead 108 and the electrical stub 29.

Figure 9:
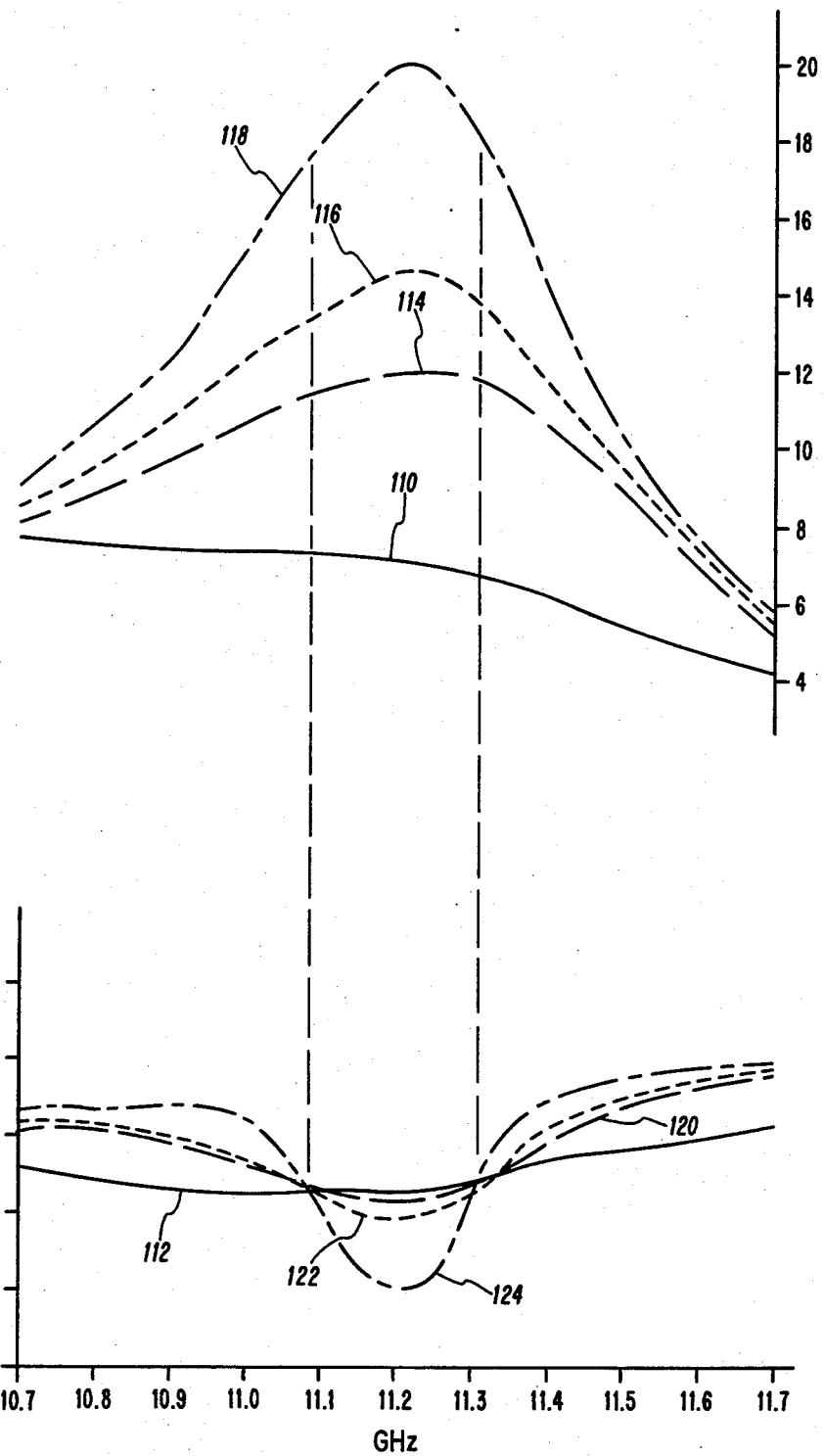
FIG. 9 comprises a set of curves illustrating the relative gain and noise as a function of frequency for different relative amounts of space feedback.

In FIG. 9, the typical gain of an FET with no space feedback is shown by curve 110, while the noise figure for this same condition of no positive feedback is shown by 112. Three other gain curves, 114, 116 and 118, illustrate respectively a partial, a midrange and a maximum usable amount of positive feedback for a given low noise RF amplifier. The peak is shown to occur at the design frequency of 11.2 GHz. A noise curve 120 provides the noise figure measured for the condition illustrated by gain curve 114. The noise figure curve 122 illustrates the amount of noise for a midrange of positive feedback, while noise curve 124 illustrates the noise for a maximum tuned amount of positive feedback. As will be noted, although outside the range of 11.1 to 11.3 GHz, the noise figure is higher for positive feedback than it is for no positive feedback, it is lower in every instance within this range of high gain.

OPERATION

It has long been common knowledge that positive feedback of the previously defined electrical type will cause the noise figure of an amplifier to rise at the same time that the gain is increasing at the same time the stability of the amplifier is decreasing. Only one of the characteristics is changing in an advantageous direction (i.e., gain) while the other two characteristics of concern are decreasing in desirability. Thus, negative feedback is typically used to increase stability and flatter gain even though it is at the expense of gain. Two examples of articles discussing feedback in microwave circuits are an article in the magazine entitled *Microwaves*, October 1978, starting on page 66, and an article in the *Microwave Journal*, March 1980, starting on page 39.

Thus, feedback is certainly not a new technique in and of itself, and the novelty presented here is space feedback utilizing the feedback of signals obtained from the field generated in the area around the field effect transistor and its associated tuned components, such as tuning stubs, ground plane tuners, and to a small extent, transmission line means.

As previously indicated, the ability to tune the low noise amplifier module, comprising the apparatus of FIG. 1, in a controlled test environment separate from the operating circuit, is a definite advantage in testing the operability of a circuit. Since the low noise amplifier is adjusted to a standardized set of values, this eliminates a wide range of parameter variations for the overall circuit, thus the remaining portion of the circuit can more easily be adjusted and checked for component inoperability or components that are out of tolerance. Further, a through transmission line can be placed between the leads leading to the opening, illustrated more clearly in FIG. 4, into which the module is normally inserted and circuit parameters tested without the amplifier. This approach eliminates the requirement to unsolder components and possibly destroy same. The present design approach provides an advantageously short electrical path for grounding the source leads on the FET.

While the ground plane tuners comprising the tuning housings 38 and 40 and their associated screws are identical for the gate and drain side, they could be different if the gate and drain impedance ranges were to be significantly different. As illustrated, the tuner housings are soldered to the ground plane over the ground plane cutouts beneath the quarter wave transformer conductors 16 and 18. These housings, in combination with the tuning screws, form a sealed compartment on the ground side which eliminates radiation losses and problems that could result from improper ground plane contact between the substrate ground and the mounting plate. The two tuning screws in each tuner are uniformly advanced into the housing 38 or 40, while observing noise figure and gain at the desired RF input frequency. The adjustable gate tuners, using the screws associated with the housing 38 beneath the gate transmission path tuning means 18, are primarily adjusted to reduce the noise figure. The drain tuners comprising housing 40 are adjusted to primarily maximize the gain. In one embodiment of the invention, the screws such as 24, 26, 36 and 75 are friction mounted so that they do not require any further locking devices.

The stubs, 20 and 29, forming a portion respectively of the transmission line paths 16 and 18 form open circuited low impedance stubs. These stubs are located adjacent the FET terminals to physically separate the tuners from the FET package itself. This configuration of connections in the modules allows the proper angle of the desired reflection coefficient to be obtained while the magnitude of the signal is obtained from the quarter wave transformer comprising the adjustable screw tuning means.

While the quarter wave transformers are tuned to vary primarily the magnitude of the reflection coefficient at the FET terminals, the angle is also varied within a limited range. This limited range of variation is used to further adjust the fixed angle as set by the stubs.

As will be ascertained in the art, the width of the transformer means 16 and 18 is enlarged from that of the conductors 30 and 32 to compensate for the reduced dielectric constant (compared to the substrate dielectric constant). The sides of the quarter wave transformer means are tapered to provide a more gradual transition from the 50 ohm narrow line width to the low impedance wide line width of the quarter wave transformer.

The previously referenced article in the *Microwave Journal* discussed the use of negative and positive feedback to control the gain and return loss of broadband gain type RF amplifiers. The feedback circuits used parallel negative feedback, located on the substrate, for the low frequency end of the operating frequency range to reduce gain and flatten the gain response. At the upper end of the RF band, the feedback circuits changed phase to cause the feedback to become positive and increase gain where it is typical for the gain to roll off. Although the noise figure is mentioned, there is very little in the article beyond mentioning that the noise figure was of a low enough value that the author did not believe noise to be a problem. Rather, he commented that the noise level remained at acceptable levels over the bandwidth in question. Applicant is sure that if the noise figure had been significantly reduced as ascertained in the present situation, there would have been some mention of this in the article.

Also, the article referenced in the *Microwave Journal* did not provide particular mention of noise figure, other than the fact that noise was a function of 1/F.

Even though neither of the referenced articles made particular mention of noise figure, it is common knowledge, as previously mentioned, that positive feedback typically will raise the noise figure of an amplifier. The data in the graph of FIG. 9 illustrates that when positive feedback is used through the use of the space feedback metal tuning means 81 between the drain and gate of the FET terminals by perturbing the normal electric field in the space above the FET, the gain is increased and the noise figure is decreased from that found without such feedback. This betterment of the gain and noise figures simultaneously is thus contrary to what is typically expected by prior art experts. As the gain exceeded 20 dB, the amplifier used in providing the graph did break into oscillations, but below this critical value there appeared to be no objectionable stability problems.

Further, there is no data in the prior art as far as is known to the present Applicant, whereby the noise figure should be so definitely decreased in the area of maximum gain of the amplifier. Although the bandwidth over which the noise figure is less than the untuned value is narrow, there are definite applications where low noise figure and high gain are required only at spot frequencies. In such applications, this feedback technique is most suitable and provides for significant economies in construction and size of the end result product.

The space feedback metal tuning means 81 provides positive feedback between the drain and gate of the FET terminals by perturbing the normal electric field in the space above the FET. At the same time that the gain is being increased, the noise figure is being decreased with this positive feedback. The enhancement of gain and noise figure simultaneously is contrary to what the prior art experts would normally expect. In other words, it would normally be expected that the noise figure should go up as positive feedback is increased to raise the gain, if it behaved according to the way that normal feedback has been described in the prior art literature.

Although the method in which the space feedback device operates is not fully understood, it is known that it is obtained by a metal reflecting surface suitably located over the FET device and its associated impedance matching circuits. The legs, such as 87, provide further improvement in the gain and noise figures over those figures obtained by just the surface 85 of the tuning means 81.

Although I have described an inventive concept comprising a drop-in module and a space feedback tuning means, I wish to be limited not by the specific embodiments illustrated, but only by the scope of the appended claims, wherein I claim:

1. Enhanced signal amplifying apparatus comprising, in combination:

substrate means defining a plane, including first and second sides, having ground plane means attached to said first side;

solid state signal amplifying means including signal input means and signal output means mounted on said second side of said substrate means;

first signal network tuning means including signal field radiating means attached to said second side of said substrate means and electrically connected to said signal input means of said solid state signal amplifying means;

second signal network tuning means including signal field radiating means attached to said second side of said substrate means and electrically connected to said signal output means of said solid state signal amplifying means; and space positive feedback means mounted at an angle with respect to said substrate means over said first and second signal network tuning means for perturbing the field radiated thereby and for increasing the gain in said signal amplifying apparatus.

2. Apparatus as claimed in claim 1, wherein:

said first and second tuning means each include transmission line stub means for fixed impedance matching; and said first and second tuning means also each include screw type means for adjusting the phase and magnitude of the reflection coefficient at the interface to said solid state signal amplifying means.

3. Enhanced signal amplifying apparatus comprising, in combination:

substrate means, including first and second sides, having ground plane means attached to said first side;

solid state signal amplifying means including signal input means and signal output means mounted on said second side of said substrate means;

first signal network tuning means including signal field radiating means attached to said second side of said substrate means and electrically connected to said signal input means of said solid state signal amplifying means;

second signal network tuning means including signal field radiating means attached to said second side of said substrate means and electrically connected to said signal output means of said solid state signal amplifying means; and positive space feedback means mounted at an angle with respect to said substrate means over said first and second signal network tuning means for containing the field radiated thereby and for increasing the gain in said signal amplifying apparatus.

4. Apparatus as claimed in claim 3, wherein:

said first and second tuning means each include transmission line stub means for fixed impedance matching; and said first and second tuning means also each include screw type means for adjusting the phase and magnitude of the reflection coefficient at the interface to said solid state signal amplifying means.

* * * * *